US006918047B1

(12) United States Patent
Sita et al.

(10) Patent No.: US 6,918,047 B1
(45) Date of Patent: Jul. 12, 2005

(54) APPARATUS FOR HIGH DATA RATE SYNCHRONOUS INTERFACE USING A DELAY LOCKED LOOP TO SYNCHRONIZE A CLOCK SIGNAL AND A METHOD THEREOF

(75) Inventors: Richard K. Sita, Audubon, NJ (US); Carl Mizuyabu, Thronhill (CA); Oleg Drapkin, Richmond Hill (CA)

(73) Assignee: ATI International, Srl, Hastings Christ Church (BB)

( * ) Notice: Subject to any disclaimer, the term of this patent is extended or adjusted under 35 U.S.C. 154(b) by 577 days.

(21) Appl. No.: 09/657,255

(22) Filed: Sep. 7, 2000

(51) Int. Cl.[7] .......................... G06F 1/12; G06F 13/00; H04L 7/04
(52) U.S. Cl. ...................... 713/401; 713/400; 713/600; 713/601; 711/167
(58) Field of Search ................................ 713/400, 401, 713/600, 601; 711/167; 375/376, 373; 327/156, 158

(56) References Cited

U.S. PATENT DOCUMENTS

| | | | | |
|---|---|---|---|---|
| 5,870,445 A | * | 2/1999 | Farwell | 375/371 |
| 6,003,118 A | * | 12/1999 | Chen | 713/401 |
| 6,081,145 A | * | 6/2000 | Bandai et al. | 327/231 |
| 6,137,327 A | * | 10/2000 | Schnell | 327/158 |
| 6,150,863 A | * | 11/2000 | Conn et al. | 327/270 |
| 6,446,180 B2 | * | 9/2002 | Li et al. | 713/401 |
| 6,487,648 B1 | * | 11/2002 | Hassoun | 713/400 |
| 6,587,534 B2 | * | 7/2003 | Hassoun et al. | 375/376 |

FOREIGN PATENT DOCUMENTS

JP   11025030 A   *   1/1999   ........... G06F/13/16

OTHER PUBLICATIONS

Spagna, F.; "Phase locked loop using delay compensation techniques", Computers and Communications, 2000. Proceedings ISCC 2000. Fifth IEEE Symposium on, Jul. 3–6, 2000, Page(s): 417–423.*

* cited by examiner

Primary Examiner—John R. Cottingham
Assistant Examiner—James K. Trujillo
(74) Attorney, Agent, or Firm—Toler, Larson & Abel, LLP

(57) ABSTRACT

A reference signal input of a delay locked loop is connected to receive a reference clock. The delay locked loop provides a drive clock that drives a clock distribution tree. One of the endpoints of the clock distribution tree is connected to a feedback reference of the delay locked loop. By using one the endpoints as a feedback loop to the delay locked loop the signal received at components attached to the endpoints of the distribution tree can be synchronized to the reference input received at the delay locked loop.

20 Claims, 7 Drawing Sheets

APPARATUS FOR HIGH DATA RATE SYNCHRONOUS INTERFACE USING A DELAY LOCKED LOOP TO SYNCHRONIZE A CLOCK SIGNAL AND A METHOD THEREOF

FIELD OF THE INVENTION

The present invention relates generally to a method and apparatus for high data rate synchronization, and more specifically to compensation techniques associated with such a method and apparatus.

BACKGROUND OF THE INVENTION

Systems having high speed synchronous interfaces are subject to timing variations in their signals that can limit overall system performance. For example, a system having Single Data Rate (SDR) Synchronous Dynamic Random Access Memory (SDRAM) device typically includes a memory controller, a printed circuit board, and a memory device (SDRAM). Between the memory controller and the memory device there is a synchronous digital communication channel that is generally part of a printed circuit board. Timing variances occur in the signals that are transmitted over the interface due to static and dynamic variations.

Factors causing static timing variations include: length variations in printed circuit board traces among individual traces that make up a common data channel or bus; length variations in wire traces among individual wire traces that make up a common data channel or bus on a semiconductor substrate, such as the memory controller; propagation delay differences between output drivers for individual signals that make up the data channel; and variations in the processing of devices, especially semiconductor devices.

Factors causing dynamic timing variations include differences in temperature and voltage, which affect the drive characteristic of semiconductor device components. For example, a clock distribution network having a plurality of buffers or drivers distributing a specific clock signal will have a varying propagation delay as the drive characteristics of the buffers and drivers varies with temperature and voltage.

All of the dynamic and static factors contribute timing variations and uncertainty in high-speed synchronous interfaces. This is especially problematic for READ cycle where the inability to predict exactly when a READ data from a memory will arrive at the latching elements inside the memory controller. This uncertainty is typically accounted for with timing margin against the setup and hold requirements of the latching device, however, increasing setup and hold margin reduces the maximum clock frequency. Therefore, a method and apparatus that reduces timing variations in a system apparatus would be useful.

Figure 1:
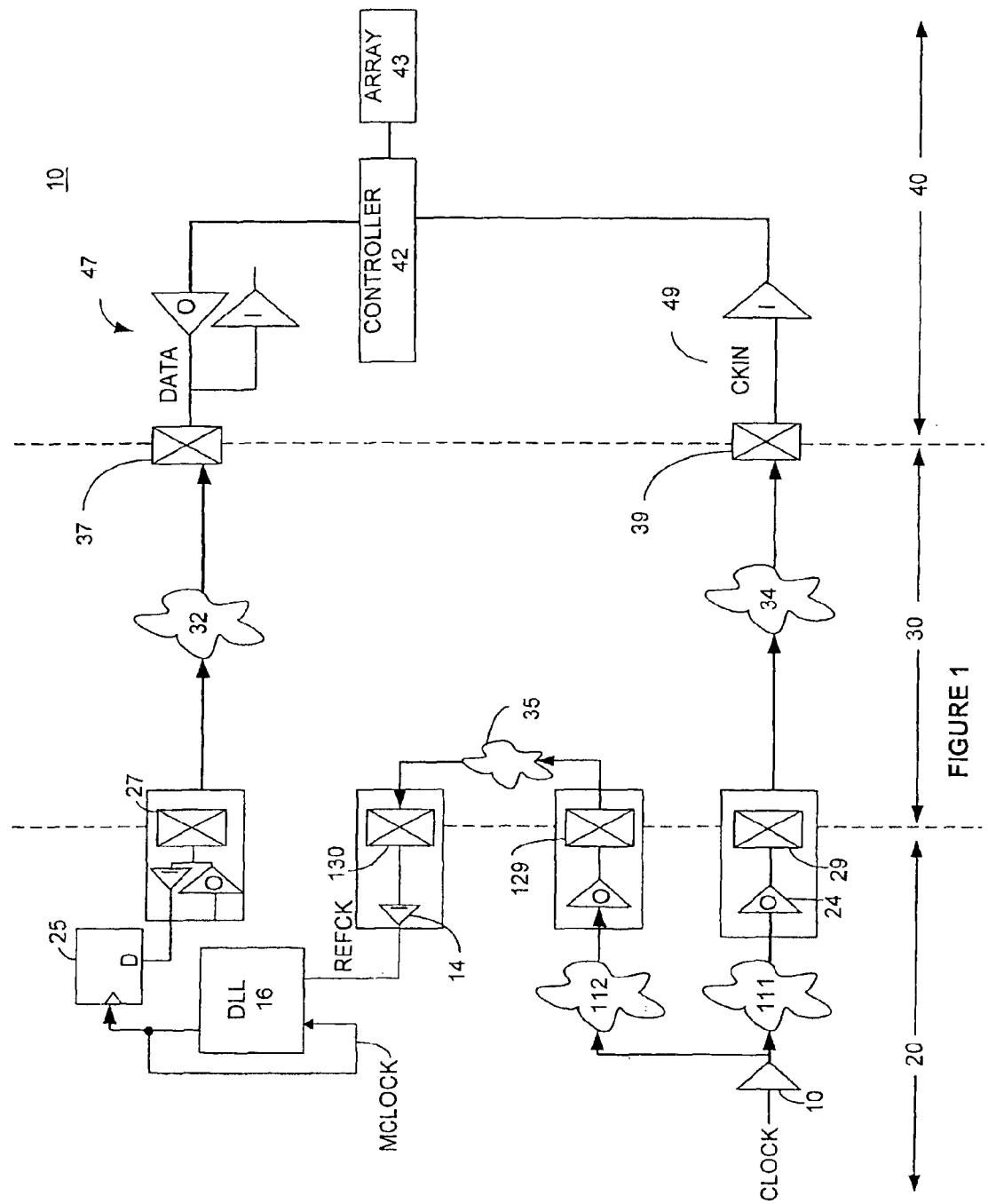
FIG. 1 illustrates, in block diagram form, an apparatus in accordance with a specific embodiment of the present invention.

One skilled in the art will appreciate that elements in the figures are illustrated for simplicity and clarity and have not necessarily been drawn to scale. For example, the dimensions of some of the elements in the figures are exaggerated relative to other elements to help to improve understanding of embodiment(s) of the present invention.

DETAILED DESCRIPTION OF THE DRAWING

In a specific implementation of the present invention, a reference signal input of a delay locked loop is connected to receive a reference clock. The delay locked loop provides a drive clock that drives a clock distribution tree. One of the endpoints of the clock distribution tree is connected to the feedback reference of the delay locked loop. By connecting one the endpoints to the feedback reference of the delay locked loop, the signals received at components attached to the endpoints of the distribution tree can be synchronized to the reference input received at the delay locked loop. Synchronizing the end point signals to the reference signals allows for the compensation of static time variations, due to propagation delays of the clock distribution tree, and the compensation of dynamic timing variations due to the components that make up the clock distribution tree. FIG. 1 illustrate specific embodiments of the present invention.

FIG. 1 illustrates a system in accordance with a specific embodiment of the present invention. Specifically, FIG. 1 illustrates a region 20 that corresponds to a portion of a semiconductor device 20 (device 20), a region 30 that corresponds to a portion of a circuit board 30, and a region 40 that corresponds to a semiconductor device 40 (device 40). Each of the regions has substrates with associated components or features. For example regions 20 and 40, which are semiconductor devices, can have electronic components, such as the latch 25 and the controller 42, formed on their respective substrates. Note that the interfaces 27, 29, 37, 39, 129, and 130 represent connections between the circuit board 30 and the semiconductor devices 20 and 40. For example, the interface 27 includes a circuit board pad, a semiconductor pad, packaging interconnects (if any), and fastening materials such as solder.

Routing paths 32 and 34 are formed on the circuit board 30 are to connect the devices 20 and 40 to one another. For example, routing path 34 represents the trace(s) and components, if any, that provide a signal from the interface 29, of device 20, to the interface 39, of device 30. Connections between interface layers, such as vias, are considered part of the traces. In one embodiment, the path 34 is a single continuous trace. In an alternate embodiment, the path 34 can include discrete traces that are connected through intermediate drivers that provide a signal from interconnect 29 to the interconnect 39. For purposes of discussion, it will be assumed that any drivers or logic devices in the path 34 are combinational logic devices that do not require additional clocking.

In one implementation, the components illustrated as part of device 20 are part of a memory controller that control access to a memory 40. It will be appreciated, that the devices 20 and 40 can include other functions in addition to those illustrated. For example, the device 20 can include other data processing modules such as a graphics driver, video driver, and audio driver. The memory device 40 can be any type of memory including volatile or non-volatile memories. In a specific implementation, the device 40 is a SDR SDRAM.

During a read operation, a memory controller associated with device 20 generates address and control signals which are provided to the memory device 40. Subsequent to the address and control signals being received at the controller 42 of the device 40, a clock signal is received at interconnect 39. The clock signal received at interconnect 39 causes a data signal to be provided from the memory 40 at the interconnect 37. The data signal provided at interconnect 37 is received at the interconnect 27 of device 20 and subsequently propagated to the data input of the latch 25.

Figure 2:
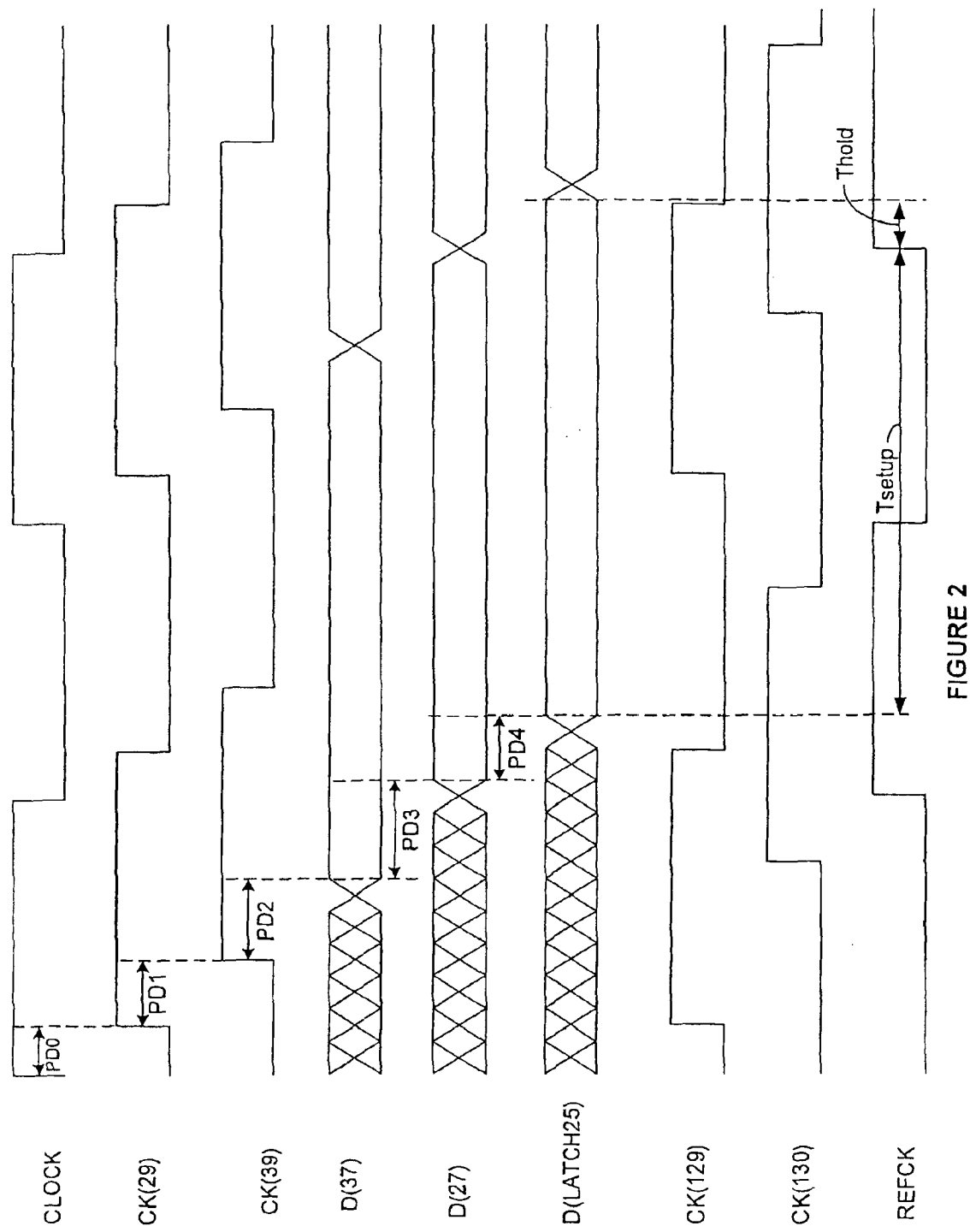
FIG. 2 illustrates, in timing diagram form, a timing relationships associated with the apparatus of FIG. 1.

FIG. 2 illustrates propagation delays associated with the CLOCK signal from device 20 to the memory device 40 back to the data input of the latch 25 of device 20. Specifically, a clock signal labeled CLOCK is illustrated as being generated on the device 20, and representations of the CLOCK signal at various physical locations are illustrated in FIG. 2. For example, the signal labeled CK(29) represents the CLOCK signal as would be interpreted at the interconnect 29, while the signal labeled CK(39) represents the signal as would be interpreted at the interconnect 39.

A propagation delay time PD0 is introduced to the CLOCK signal as it propagates to the interconnect 29. The propagation time PD0 includes static and dynamic time variations through the component 24 and its associated traces. For example the speed of the driver component 24 can vary dynamically based upon differences in voltage, and temperature.

A propagation delay time PD1 occurs as the CLOCK signal propagates from interconnect 29 to interconnect 39. The propagation time PD1 includes primarily static time variations from traces associated with path 34. The propagation time PD1 also includes dynamic time variations when path 34 includes active components.

A propagation delay PD2 through device 40 begins once an active edge of a representation of the CLOCK signal is received at interconnect 39, and ends when the read DATA is asserted, in response to receiving the active clock edge, on the interconnect 37.

A propagation delay time PD3 occurs as the DATA propagates from interconnect 37 to interconnect 27. The propagation time PD3 includes primarily static time variations when path 32 includes primarily traces, and includes dynamic time variations when path 32 includes active components.

A propagation delay time PD4 occurs as the read DATA propagates from interconnect 27 to the data input of the latch 25. The propagation time PD4 includes both static and dynamic time variations.

Figure 3:
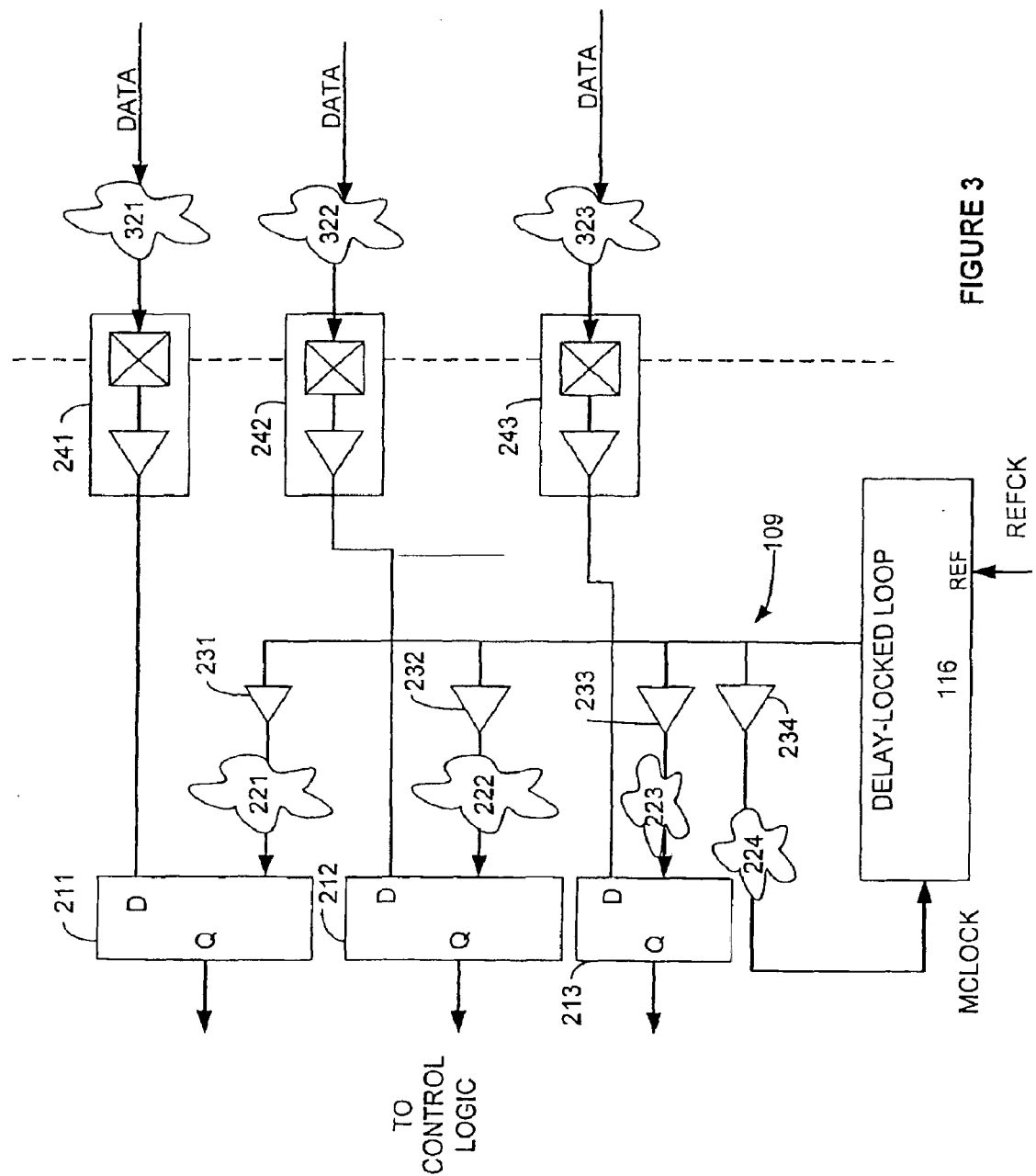
FIG. 3 illustrates, in block diagram form, a portion of the apparatus of FIG. 1 in greater detail.

The total propagation delay associated with receiving data at the latch 25 is equal to the sum of PD0 through PD4. Because static delays can vary system to system, and because dynamic delays vary over time within a system, it is not possible to predict precisely when the READ data will arrive at the latch 25. In the prior art, this uncertainty is typically accounted for with timing margin against the specified setup and hold requirement of the latch 25, thereby reducing the maximum obtainable clock frequency. In accordance with a specific embodiment of the present invention, the effects of the total propagation delay on timing margin are removed through the use of a reference clock signal that, in one embodiment, is delayed by an amount approximately equal to the sum of propagation delays PD1 and PD3. FIG. 3 illustrates a reference clock signal (REFCK) being received at a reference input (REF) of a delay locked loop (DLL). REFCK is generated using the CLOCK signal from device 20 to generate a clock having a delay similar to the data path delay described above with reference to FIG. 2. In one embodiment, the delay from CLOCK is obtained by routing a representation of the CLOCK signal through interconnect 129, onto the circuit board 30; through circuit board path 35, to interconnect 130, and finally through an input buffer 14. This is illustrated in FIG. 3, where CK(129) is a representation of the CLOCK signal at interconnect 129, and CK(130) is a representation of the CLOCK signal at interconnect 130. The delay introduced between CK(129) and CK(130) is approximately equal to the sum of PD1 and PD3.

In a specific embodiment, the circuit board path 35 is designed to match the cumulative trace length of path 34 and path 32. This matching of trace lengths compensates for static variations in the printed circuit board, since the path 35 will have approximately the same static variation as the combination of paths 34 and 32. In another embodiment, the static variations of the paths 34 and 32, if any, can be compensated for by matching active components as well as the trace length. In yet another embodiment, one or more active components can be included in path 35 to match static and dynamic delays through the device 40 or the path 24. For example, if path 34 includes a clock driver, a similar clock driver can be included in path 35. In another embodiment, path 35 can be driven by an output of a clock driver of path 34 instead of by a separate output of the device 20. The REFCK signal, which is a representation of CLOCK, can then be used to compensate for the propagation delay associated with READ data from the memory 30.

In another embodiment of the invention, static and dynamic variations associated with providing a representation of the REFCK clock signal to the clock input of the latch 25. For example, referring to FIG. 3, a clock tree 109 is used to drive a plurality of latches, including latches 211–213. Because of timing variations between received data signals at the data inputs of latches 211–213, and an active clock edge received at the clock input of the latches 211–213, the timing margins of the latches needs to be relaxed, thereby limiting the maximum obtainable clock frequency.

The output of the DLL 116 drives the clock distribution network that includes paths 221–224. The clock distribution network provides clock signals to each of the latches 211–213. One leaf (endpoint) of the clock distribution network provides feedback (MCLOCK) to the feedback input of the DLL, while the REFCLK signal drives the reference input of the DLL.

The DLL functions to match the MCLOCK signal to the REFCK signal by adjusting the position of the clock driven onto the distribution network. For example, the DLL is used to position the clocks as received at the endpoints of the clock distribution network to be approximately synchronous with the REFCLK. This synchronization, performed by the DLL, compensates for dynamic delay variations of the clock distribution network. Also, when the REFCLK signal is selected to match at least a portion of the propagation delay associated with receiving data during a READ access of device 40, and the MCLOCK signal is the clock signal from an end point of the distribution network that represents when READ data is to be latched, the DLL is used to position the clocks at the endpoints of the clock distribution network to be approximately synchronous with the REFCLK. In this manner, compensation can be made for the READ data propagation time and its variations, and for the clock distribution network clock propagation time and its variations.

Note, a well-designed clock distribution tree 109 provides approximately the same propagation delay at each endpoint, and dynamic time delays are equal at all endpoints. This is the reason why a single endpoint can generally represent the delay of the entire tree.

FIG. 2 illustrates the hold time (Thold) and the set up time (Tsetup) obtained between the rising edge of REFCK and D(Latch25). Because of the compensation techniques used to generate REFCK, the variance in the realized Thold and Tsetup times is reduced, thereby allowing for a more aggressive clock rate. Note, in another embodiment, the data at latch 25 can be latched at the falling edge of Tsetup.

The methods of FIGS. 4–7 further illustrate specific embodiments of the present invention.

Figure 4:
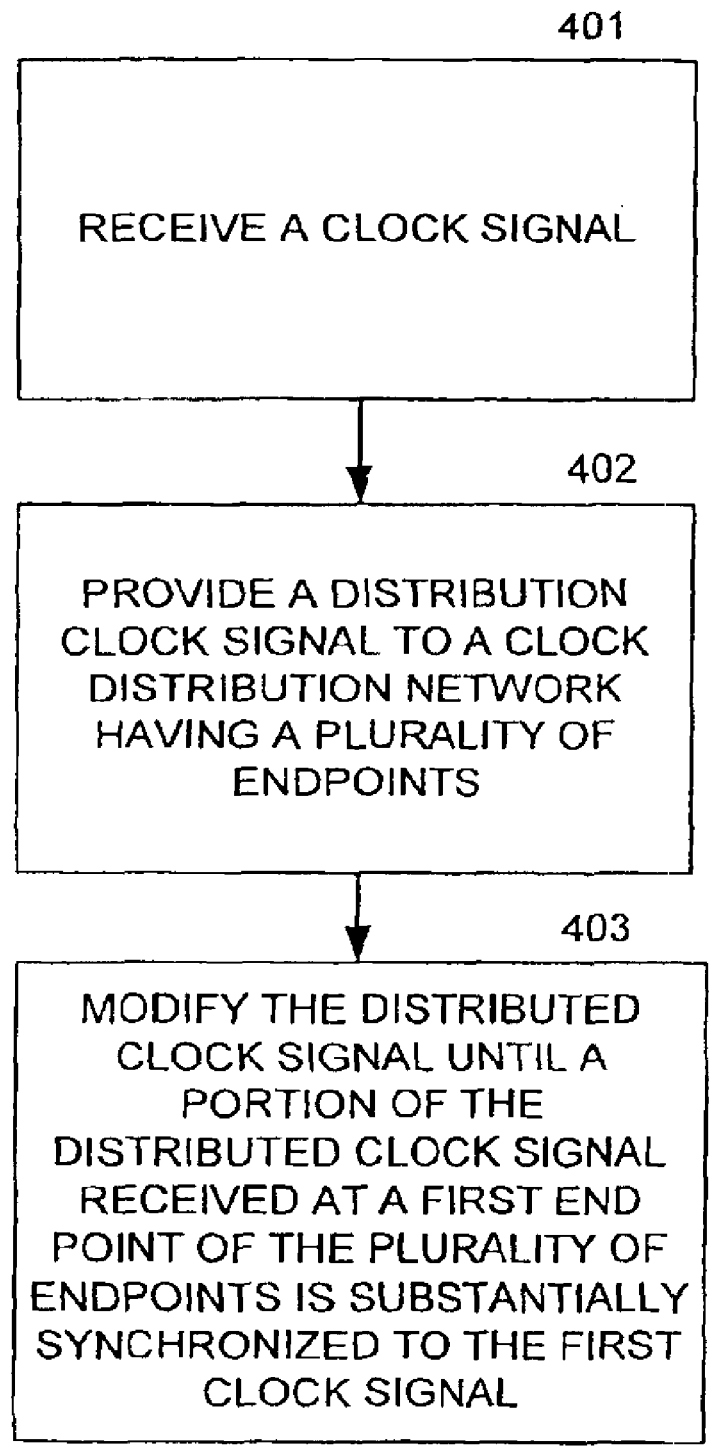
FIGS. 4–7 illustrate, in flow diagram form, methods in accordance with specific embodiments of the present invention.

At step 401 of FIG. 4, a clock signal is received. In one embodiment, the clock signal represents the reference clock that is used to generate subsequent clock(s) signals, for example, the signal REFCK of FIG. 1. In this manner, the clock signal is a delayed representation of another clock signal. For example, the clock signal can be a representation of the CLOCK signal of FIG. 1, which is delayed by matching a propagation delay path of a READ data access as previously described. In another embodiment, the clock signal can be generated from an external clock source.

At step 402, a distributed clock signal is provided to a clock distribution network having a plurality of endpoints connected to a respective plurality of components. In the example of FIG. 3, the plurality of components are latches used to latch data from a memory during a read operation. Note, the DLL can also be considered one of the plurality of components. The number of components can vary depending upon the memory configuration. The clock distribution network can have a single node that includes a plurality of traces, or it can include a plurality of nodes that are driven by a plurality of active component that distribute the clock distribution network.

At step 403, the distributed clock signal is modified based on a portion of the distributed clock signal that is received at a first end point of the clock distribution network. The modification to the distributed clock signal being driven substantially synchronizes the distributed clock signal received at the first end point of the clock distribution network to the first clock signal. This is accomplished when the distributed clock signal received as feedback at the DLL is delayed from the first clock signal so that active edges received at the first endpoint occur at approximately the same time as the active edges of the clock signal received at the reference input of the DLL. Note that the term "approximately the same" indicates that reasonable design tolerances and limitations will prevent the active edges from occurring at an absolute exact point in time. As illustrated in FIGS. 1 and 3, a DLL can be used to delay the distribution clock signal from the first clock signal.

Generally it will be desirable to select or design the first endpoint to be representative of each endpoint of the distribution network. By choosing a representative endpoint, the signals received at each of the plurality of endpoints will occur at approximately the same time as the signal received at the first endpoint. Therefore, it is generally preferred that the trace length, and any components associated with driving the first endpoint, is matched to be representative of each of the other plurality of endpoint. In one embodiment, assuming the distribution network includes only traces, the first endpoint will be chosen to have a length that is an average or median length of the traces to all other endpoints. In one embodiment, the leaf of the distribution network that is fed-back to the delay element will be specifically designed to be an average, or median representation of all leaves of the distribution network. In an alternate embodiment, a feedback loop can be formed by connecting to a leaf that is already connected to another component.

Figure 5:
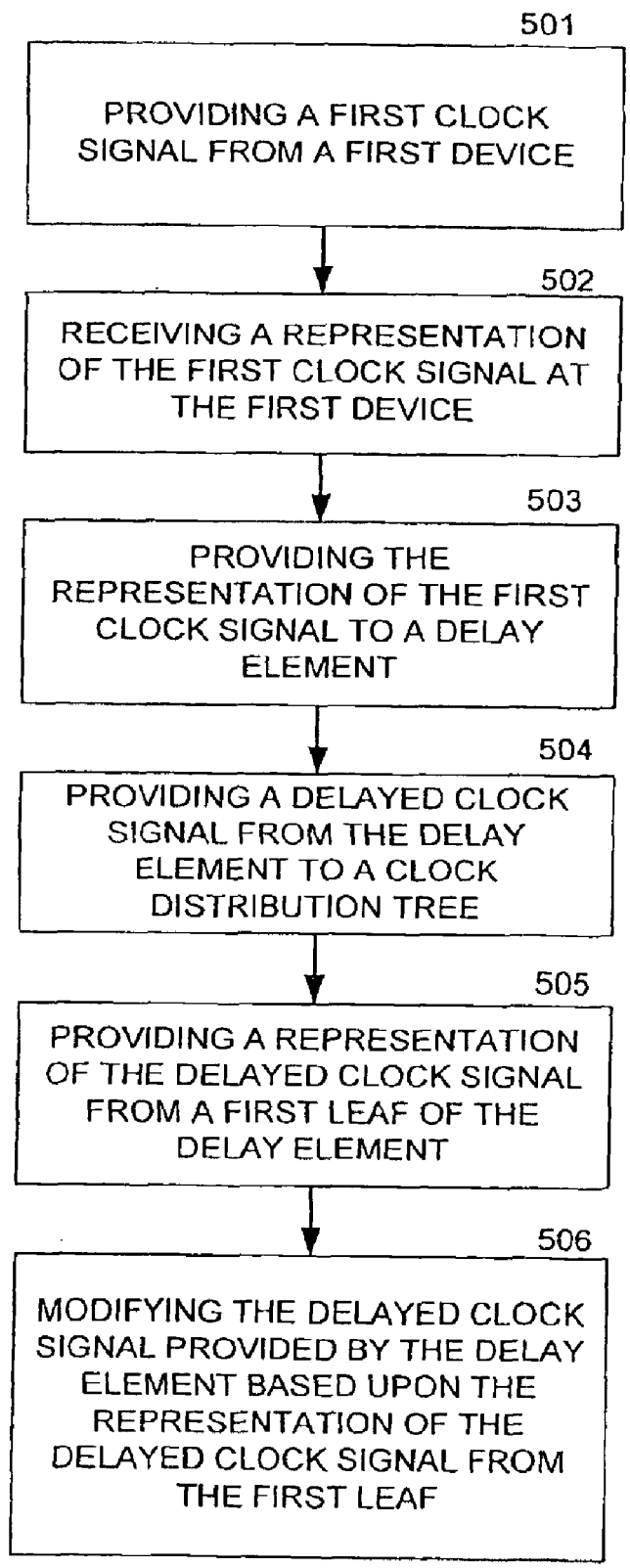

FIG. 5 illustrates an alternate method in accordance with the present invention. At step 501, a first clock signal is provided from a first device, such as device 20 of FIG. 1.

At step 502, a representation of the first clock signal is received at the first device. The representation of the first clock signal received at the first device is has been propagated away from the first device. For example, the first clock signal can be driven from the device 20 onto the printed circuit board (second device), back to the device 20.

At step 503, the representation of the first clock signal is provided to a delay element. The delay element described herein is a DLL; however, other components capable of synchronizing clock signals in the manner described can also be used. In the embodiment described herein, the representation of the first clock signal has been provided to the reference input of the DLL.

At step 504, a delayed clock signal is provided from the delay element to a clock distribution tree.

At step 505, a representation of the delayed clock signal is provided from a first leaf, or endpoint, of the clock distribution tree to the delay element. In the embodiment described herein, the delayed clock signal has been provided to the feedback input of the DLL.

At step 506, the delayed clock signal provided by the delay element is modified based upon the representation of the delayed clock signal. In one embodiment, the delayed clock signal is modified to be substantially synchronized to the first representation of the first clock signal. The delayed clock signal is synchronized to the first clock signal when it is delayed from the first clock signal so that active edges received at the first leaf occur at approximately the same time as the active edges of the representation of the representation of the delayed clock signal are received at the delay element. Note that the term "approximately the same" indicates that reasonable design tolerances and limitations will prevent the active edges from occurring at an absolute exact point in time.

Figure 6:
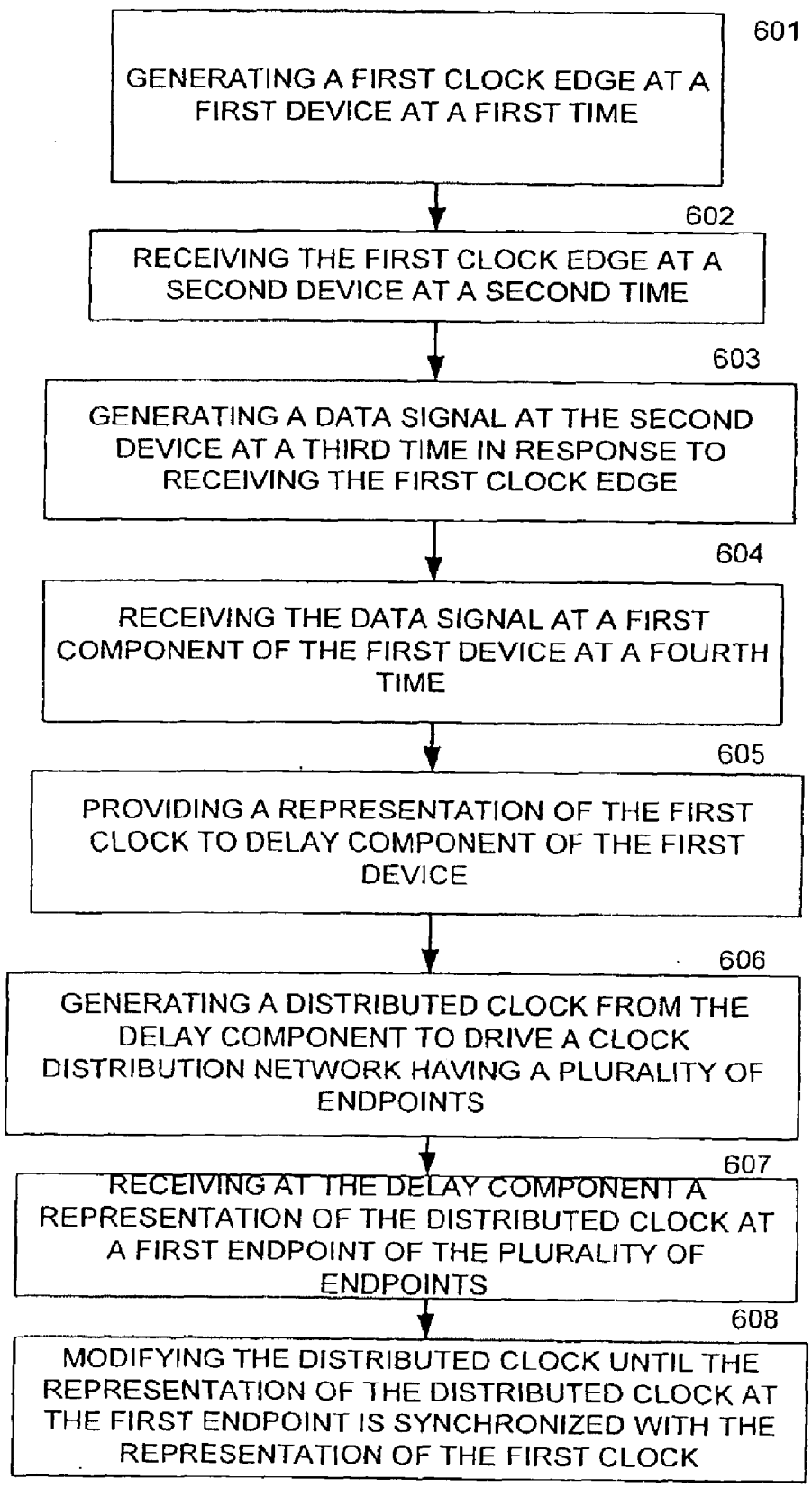

The method of FIG. 6 illustrates another embodiment of the present invention. At step 601, a first clock edge is generated at a first device at a first time. For example, the first clock edge corresponds to an edge of the signal labeled CLOCK, or the signal labeled CK(29) in FIG. 2. At step 602, the first clock edge is received at a second device at a second time. Note, an edge of the signal CK(39) of FIG. 2 corresponds to receiving the first clock edge at the second device. At step 603, a data signal is generated from a second device at a third time in response to receiving the first clock edge, see signal D(37) of FIG. 2. At step 604, the data signal is received at a first component of the first device. For example, the signal D(LATCH25) corresponds to the data being received at a data input of latch 25 of FIG. 2. At step 605, a representation of the first clock is provided to a delay element. For example, REFCK is provided to the DLL 16 of FIG. 2. At step 606, a distributed clock is generated from the delay component to drive a clock distribution network. At step 607, a representation of the distributed clock is received at the delay component. At step 608, the distributed clock is modified until the representation of the distributed clock at the first endpoint is synchronized with the representation of the first clock.

Figure 7:
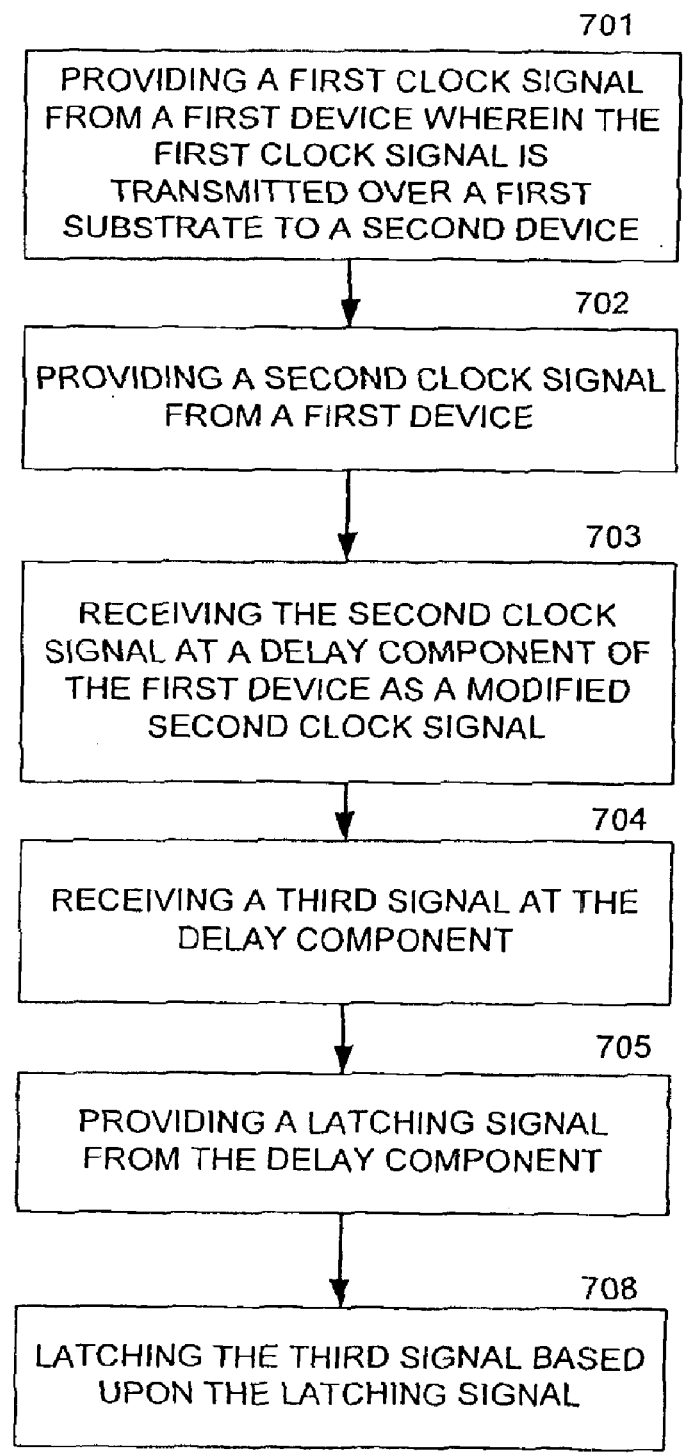

The method of FIG. 7 illustrates another embodiment of the present invention. At step 701, a first clock is provided from a first device and is transmitted over a first substrate to a second device, where the first substrate is not part of the first or second device. For example, referring to FIG. 1, the first substrate corresponds to the circuit board 30. At step 702, a second clock signal is provided from the first device and transmitted over a second substrate that is not part of the first or second devices. At step 703, the second clock signal is received at a delay component of the first device as a modified second clock signal. For example, the second clock signal corresponds to a signal transmitted through path 35 of FIG. 1. At step 704, a third signal is received at a storage component of the first device. Specifically the third signal has been transmitted over a third substrate, that is not part of the first device or the second device, in response to the first clock signal. In one embodiment, the first, second, and third substrates are common substrates, such as the circuit board substrate 30 of FIG. 1. At step 705, a latching signal is provided from the delay component. Generally the latching signal will be a delayed representation of the first clock signal. At step 706, the third signal is latched, or stored, at the storage in response to the latching signal.

In the foregoing specification, the invention has been described with reference to specific embodiments. However, one of ordinary skill in the art appreciates that various modifications and changes can be made without departing from the scope of the present invention as set forth in the claims below. For example, the DLL can synchronize to a feedback signal that is a shifted representation of the signal received at the endpoints of the distribution tree. For example, the DLL can lock to a signal that is 90° out of phase from a signal at an endpoint of the distribution tree. In addition, the DLL can synchronize to a specific edge, such as the rising edge, of the clock signal and provide a signal to the clock distribution network having a duty cycle that is different that the reference clock. In addition, other methods besides matching trace lengths can be used to match the off chip propagation delay. For example, an active or passive circuit could be used to simulate a specific delay, however, this will generally introduce additional timing variations into the system. Furthermore, the memory 40 can provide a clock signal to be received at the reference input of the DLL. Accordingly, the specification and figures are to be regarded in an illustrative rather than in a restrictive sense, and all such modifications are intended to be included within the scope of present invention. Benefits, other advantages, and solutions to problems have been described above with regard to specific embodiments. However, the benefits, advantages, solutions to problems, and any element(s) that may cause any benefit, advantage, or solution to occur or become more pronounced are not to be construed as a critical, required, or essential feature or element of any or all the claims.

We claim:

1. A method comprising:
   receiving a first clock signal;
   providing a distributed clock signal to a clock distribution network having a plurality of endpoints connected to a respective plurality of components, the plurality of endpoints including a first endpoint that drives an input to a delay locked loop and a second endpoint that drives a component that is not part of the clock distribution network, where the first endpoint is at a same propagation level as the second endpoint; and
   modifying, using the delay locked loop, the distributed clock signal until a portion of the distributed clock signal received at a first end point of the plurality of endpoints is substantially synchronized to the first clock signal.

2. The method of claim 1, wherein modifying includes providing a delayed representation of the distributed clock signal at the first end point.

3. The method of claim 1, further including:
   providing a second clock signal from a first device wherein the first clock signal is a delayed representation of the second clock signal.

4. The method of claim 3, wherein providing the second clock signal includes providing the second clock signal to a propagation path manufactured onto a first substrate, wherein the first substrate is not part of the first device.

5. The method of claim 4, wherein receiving the first clock signal includes receiving the first clock signal at the first device.

6. The method of claim 3, wherein receiving the first clock signal includes receiving the first clock signal at the first device.

7. The method of claim 1, further including:
   providing a second clock signal from a first device wherein the first clock signal is a delayed representation of the second clock signal.

8. The method of claim 7, wherein providing the second clock signal includes providing the second clock signal to a propagation path manufactured onto a first substrate, wherein the first substrate is not part of the first device.

9. The method of claim 8, wherein receiving the first clock signal includes receiving the first clock signal at the first device.

10. The method of claim 7, wherein receiving the first clock signal includes receiving the first clock signal at the first device.

11. A method comprising:
    providing a first clock signal from a first device;
    receiving a representation of the first clock signal from a device external to the first device at the first device;
    providing the representation of the first clock signal to a delay element;
    providing a delayed clock signal from the delay element to a clock distribution tree, wherein the delayed clock signal is based upon the representation of the first clock signal, and the clock distribution tree includes a plurality of leaves that provide the delayed clock signal to a respective plurality of components;
    providing a representation of the delayed clock signal from a first leaf to the delay element, where the first leaf is one of the plurality of leaves; and
    modifying the delayed clock signal provided by the delay element based upon the representation of the delayed clock signal from the first leaf.

12. The method of claim 11, wherein modifying the delayed clock includes modifying the delayed clock by delaying the first clock by an amount approximately equal to a first propagation delay and a second propagation delay, wherein the first propagation delay is equal to a delay along a delay path from the first device to a second device, and the second propagation delay is equal to a delay along a delay path from the second device to the first device.

13. A method comprising:
    generating a first clock edge at a first device at a first time, wherein the first clock edge is associated with a first clock having a first period;
    receiving the first clock edge at a second device at a second time, wherein the time between the first time and the second time is a first propagation delay;
    generating a data signal at the second device at a third time in response to receiving the first clock edge, wherein the time between the second time and the third time is a second propagation delay;

receiving the data signal at a first component of the first device at a fourth time, wherein the time between the third time and the fourth time is a third propagation delay;

providing a representation of the first clock to a delay component of the first device, wherein the representation of the first clock is approximately equal to the first clock delayed by an amount approximately equal to the sum of the first, second and third propagation delays;

generating a distributed clock from the delay component to drive a clock distribution network having a plurality of endpoints;

receiving at the delay component a representation of the distributed clock at a first endpoint of the plurality of endpoints; and modifying the distributed clock until the representation of the distributed clock at the first endpoint is synchronized with the representation of the first clock.

14. The method of claim 13, wherein the second device is a memory device.

15. The method of claim 13, wherein the first period is less than approximately 5 nanoseconds.

16. An apparatus comprising:

a delay locked loop having a reference input, a feedback input, and a delayed reference output;

a distribution network having a first node connected to the delayed reference output, and a plurality of end nodes connected to a respective plurality of components, a first end node of the plurality of end nodes connected to the feedback input of the delay locked loop, where the delay locked loop is one of the plurality of components;

a first input port having an output node coupled to the reference input of the delay locked loop, and an input node, wherein the first input port, the distribution network, and the delay locked loop are formed on a first substrate;

a first trace connected to the input node of the first input port, wherein the first trace is formed on a second substrate which is different than the first substrate; and a first output port having an output node coupled to the first trace, wherein the output port is formed on the first substrate;

a second output port having an output node connected to a second trace, wherein the second output port is formed on the first substrate, and the second trace is formed on the second substrate;

a storage device having an input coupled to the second trace and a data output coupled to a third trace, wherein the storage device is formed on a third substrate which is different from the second substrate and the third trace is formed on the second substrate;

the first input port having an input node connected to the third trace and an output node coupled an input of one of the plurality of components.

17. The apparatus of claim 16, wherein the first trace is at least as long as the sum of the lengths of the second trace and the third trace.

18. The apparatus of claim 16, wherein the distribution network is a clock distribution network.

19. A method comprising:

providing a first clock signal from a first device, wherein the first clock signal is transmitted over a first substrate to a second device, wherein the first substrate is not part of the first device or the second device;

providing a second clock signal from the first device, wherein the second clock signal is transmitted over a second substrate, wherein the second substrate is not part of the first device or the second device;

receiving the second clock signal at a delay component of the first device as a modified second clock signal;

receiving a third signal at a storage component, in response to the first clock signal, wherein a latching signal is based upon the modified second clock signal and a previous latching signal from the delay component; and latching the third signal at the storage component based upon the latching signal.

20. The method of claim 19, wherein the latching signal is delayed from the modified second signal by an amount approximately equal to a clock period of the modified second clock plus a delay time between the latching signal being generated and the latching signal latching the third signal.

* * * * *